United States Patent [19]

Cha et al.

[11] Patent Number: 5,331,322
[45] Date of Patent: Jul. 19, 1994

[54] CURRENT CELL FOR DIGITAL-TO-ANALOG CONVERTER

[75] Inventors: Kwon-Ho Cha, Seoul; Oh-Bong Kwon, Kyoungki, both of Rep. of Korea

[73] Assignee: Hyundai Electronics Industries Co., Ltd., Kyoungki, Rep. of Korea

[21] Appl. No.: 998,050

[22] Filed: Dec. 29, 1992

[30] Foreign Application Priority Data

Dec. 31, 1991 [KR] Rep. of Korea .................. 91-25763

[51] Int. Cl.$^5$ .............................................. H03M 1/66
[52] U.S. Cl. .................................. 341/136; 341/154; 307/571
[58] Field of Search ............... 341/133, 136, 153, 154; 307/241, 242, 244, 571, 572, 577, 584

[56] References Cited

U.S. PATENT DOCUMENTS

| | | | |
|---|---|---|---|
| 4,336,527 | 6/1982 | von Sichart et al. | 341/133 |
| 4,381,499 | 4/1983 | Struthoff | 307/571 |
| 4,384,274 | 5/1983 | Mao | 341/136 |
| 4,725,813 | 2/1988 | Miyada | 341/136 |
| 4,990,915 | 2/1991 | Kondoh et al. | 341/136 |
| 5,148,164 | 9/1992 | Nakamura et al. | 341/136 |

Primary Examiner—Howard L. Williams
Attorney, Agent, or Firm—Ladas & Parry

[57] ABSTRACT

This invention relates to a current cell playing a role as a current switch source in a digital-to-analog converter. According to the present invention, the current cell assembled by both p-type MOS transistor M1 for current supply and p-type MOS transistor M2 and M3 for symmetrical operation, comprises: an inverting means consisting of p-type and n-type MOS transistor M5 and M4, where the digital input signal Di is applied to each of gate terminal and where the source terminal is connected to power supply terminal Vdd and ground terminal GND; a transmission means consisting of n-type MOS transistor M7, where the digital input signal of Di is applied to its gate terminal and power supply voltage Vdd is applied to its source terminal, and p-type and n-type MOS transistors M6 and M8, where the digital input signal Di and the output signal of the said inverting means is applied to each of their gate terminal, respectively. The output signal from the said inverting and transmission means is applied to the gate terminals of the said p-type MOS transistors M2, M3 respectively.

The features of the current cell is apparent in that the signal symmetrical to MOS transistors M2 and M3 can reach the input side of digital signal determining on or off state at nearly the same time through additional circuits, thus taking advantage of the differential type which has better symmetrical operation, and thus making its design easier. Therefore, a high-speed D/A converter can be made available and can also be used in a system contain such converter.

1 Claim, 2 Drawing Sheets

CURRENT CELL FOR DIGITAL-TO-ANALOG CONVERTER

BACKGROUND OF THE INVENTION

1. Field of the Invention

This invention relates to a current cell playing a role as a current switch source in a digital-to-analog converter.

2. Description of the Prior Art

The structure of digital-to-analog converter (hereinafter 'D/A converter') to convert digital signal to analog signal is assembled in two parts, wherein one part is to generate the output current equivalent to digital value by separating the digital signal as a constant signal group and the other part is to generate the optimal output current corresponding to the said digital value.

The major performance characteristics of the D/A converter in accordance with the current switch cell and its type are as follows:

A) Linearity: This depends on the symmetrical operation of the current switching cell, and is affected by the output impedance of current source. Hence, as the matching between current sources affects the symmetrical switching operation, the current cell in differential type is suitable in terms of linearity.

B) Glitch: This depends on the incomplete synchronization of digital input signal determining on-and off-state of the current source. The glitch is related to the decoding circuit generating the digital input signal which reaches each current source, thus creating the current switch cell of differential type in the state of non-symmetrical switching. Accordingly, the performance of inverter consisting of the differential type should be considered.

C) Operation speed: The operation speed of the current switch cell is affected by the stray capacitance in output node. To reduce the said effect, common source stray capacitance should be minimized to make the switching-recovery time smaller.

FIG. 1 illustrates a circuit diagram of the current cell playing a role of current switch source, which is a basic structure of conventional D/A converter.

The current cell of the prior art comprises 3 pieces of p-type MOS transistor M1–M3. Voltage Vcmp is applied to the gate terminal of p-type MOS transistor M1, and the power supply voltage Vdd is applied to its source terminal. The drain terminal of the transistor M1 is connected to the source terminal of p-type MOS transistors M2, M3 and the drain terminals of MOS transistor M2, M3, where the digital input signal Di and reference voltage Vref are applied to their gate terminal respectively, is connected to ground (GND) and input terminal respectively.

The operation profile of the current cell in the prior art is that the output current (Iout) of the current cell is determined by reference voltage (Vcmp) supplied to the gate of MOS transistor M1, and the signal digital input Di, determining on or off-state of output of the current cell, is supplied to the gate of MOS transistor M2. MOS transistor M3, to which a constant reference voltage Vref is applied, is connected with the said MOS transistor M2 to assist the output switching.

If the said current cell as aforementioned employs various kinds of current switch cell simultaneously, however, the matching of on or off-state in each of current switch cell cannot be made available which may in turn affect the performance characteristics e.g., linearity.

FIG. 2 illustrates a circuit diagram of the current cell for another prior art D/A converter.

The current cell in FIG. 2 comprises 3 p-type MOS transistors M1–M3 and one inverter IN1 in the same manner as in FIG. 1. Reference voltage Vref is applied to the gate terminal of MOS transistor (M1), where the power supply voltage Vdd is applied to its source terminal and the drain terminal is connected to the source terminal of MOS transistors M2, M3. The drain terminal of MOS transistor M2, M3, where both digital input signal Di and inverted digital input signal Di are applied to gate terminal respectively, is assembled to generate both inverted output signal Iout and output signal Iout.

The operation profile of the current cell in the prior art is that instead of applying a constant reference voltage Vref to the gate terminal of MOS transistor M3 which generates the output signal (Iout) as shown in FIG. 1, the digital input signal Di applied to the gate of MOS transistor M2 is inverted and applied to MOS transistor M3. Thus, the switching operation of MOS transistors M2, M3 is in a symmetrical position, which is called 'differential type'. In such a D/A converter having the said differential structure, the symmetrical operation of MOS transistor (M2, M3) is of paramount importance.

The current cell as illustrated in FIG. 2 employs the inverter IN1 so as to invert the digital input signal Di applied to the gate terminal of MOS transistor M3. In order for the MOS transistors M2, M3 to be operated in complete symmetry, the difference in delay should not exist between the input time and the output time of data in inverter IN1. However, there has been much difficulty controlling the said difference in inverter.

SUMMARY OF THE INVENTION

It is a principle object of the present invention, therefore, to provide an easily-designed current cell for D/A converter which can implement a complete symmetrical operation in an attempt to well cope with the aforesaid problems of the prior art.

To this end, the present invention features a current cell for D/A converter assembled by both p-type MOS transistor M1 for current supply and p-type MOS transistors M2, M3 for symmetrical operation, wherein it comprises:

an inverting means consisting of p-type and n-type MOS transistor M5 and M4, where the digital input signal Di is applied to each of gate terminal and where the source terminal is connected to power supply terminal Vdd and ground terminal GND; and a transmission means consisting of n-type MOS transistor M7, where the digital input signal Di is applied to its gate terminal and power supply voltage Vdd is applied to the source terminal, and p-type and n-type MOS transistor M6 and M8, where the digital input signal Di and the output signal of said inverting means are applied to each of their gate terminal, respectively. The output signal from the said inverting and transmission devices is applied to the gate terminals of the said p-type MOS transistors M2,M3 respectively.

BRIEF DESCRIPTION OF THE DRAWINGS

To make the description more clear, a reference is made to the accompanying drawings, in which.

DETAILED DESCRIPTION OF AN EMBODIMENT OF THE INVENTION

Figure 1:
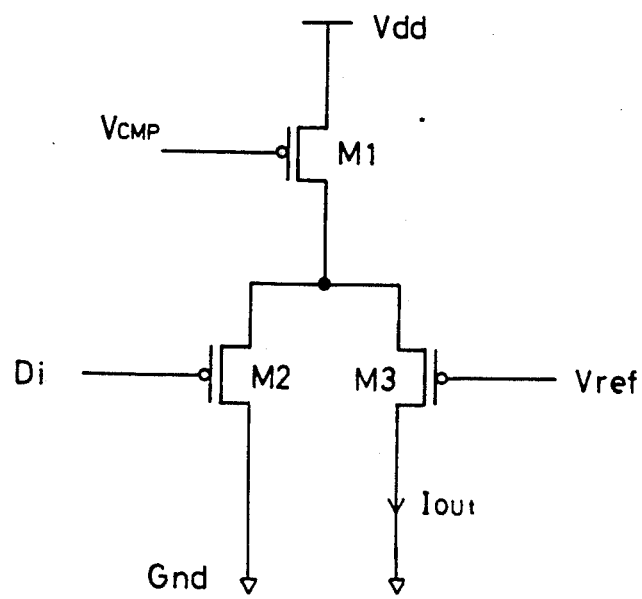
FIG. 1 and FIG. 2 illustrate circuit diagrams of the prior art current cell for digital-to-analog converter.
Figure 2:
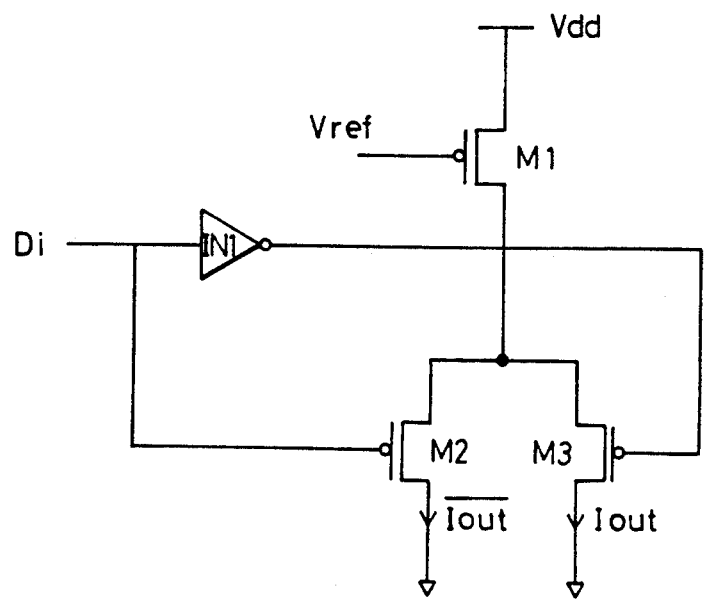
Figure 3:
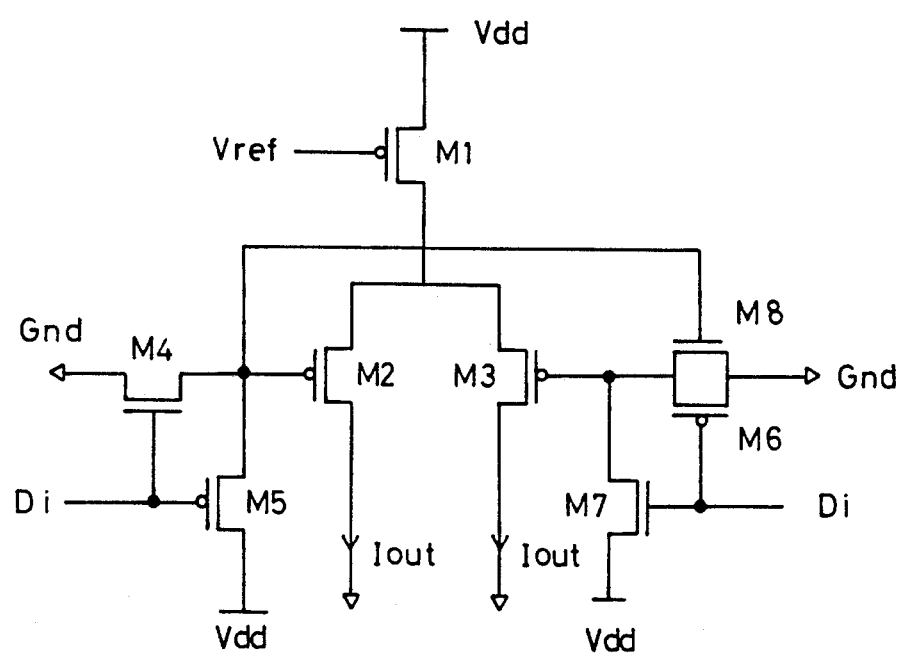
FIG. 3 illustrates a circuit diagram of the current cell for digital-to-analog converter according to the present invention.

FIG. 3 illustrates a circuit diagram of the current cell for the D/A converter according to the present invention. As illustrated in FIG. 3, the current cell for the D/A converter of the present invention is a basic structure to implement the operation of the current cell which comprises 3 p-type MOS transistors M1–M3. And transistors M4–M8 are additionally provided so as to improve the operation of the said current cell.

According to the present invention, the current cell comprises;

p-type MOS transistors M1–M3 for basic operation; inverting means consisting of p-type and N-type MOS transistor M5, M4, where the digital input signal Di is applied to each of gate terminal and where the source terminal is connected to power supply terminal Vdd and ground terminal GND; and transmission means consisting of n-type MOS transistor M7, where the digital input signal Di is applied to its gate terminal and power supply voltage Vdd is applied to the source terminal, and p-type and n-type MOS transistor M6 and M8, where the digital input signal Di and the output signal of the said inverting means is applied to each of their gate terminals, respectively.

The output signal from the said inverting and transmission means is applied to the gate terminals of the said p-type MOS transistors M2, M3 respectively.

Concerning the current cell for the D/A converter of FIG. 3 as stated above, the current generated by MOS transistor M1 is supplied as output current, in accordance with the digital input signal Di applied to the gates of MOS transistors M2 and M3. The following is a detailed description on such operation.

Firstly, the full scale amount of the current is determined in accordance with reference voltage Vref, a reference bias voltage in the gate of p-type MOS transistor M1 which makes a basic operation of the current cell. Hence, if the digital input signal Di is high, the input signal Di becomes inverted since n-type MOS transistor M4 is in the on state whilst p-type MOS transistor M5 is in the off state. With the inverted low-state signal applied to the gate terminal of p-type MOS transistor M2, MOS transistor M2 are in the on state. Therefore, MOS transistors M1, M2 is in the saturation region to obtain cascade current source having a high output impedance.

Simultaneously, due to a high digital input signal Di, p-type MOS transistor M6 is in the off state and n-type MOS transistor M7 is in the on state. Then, with a high-state signal applied to p-type MOS transistor M3, transistor (M3) is in the off state. Therefore, MOS transistors M2 and M3 determining the output of on or off-state can implement the symmetrical operation by the setup of the present invention.

Also, if the digital input signal is low, the input signal Di becomes inverted since n-type MOS transistor M4 is in the on state whilst p-type MOS transistor M5 is in the off state. With the high-state signal applied to the gate terminal of p-type MOS transistor M2, MOS transistor M2 is in the on state. Simultaneously, due to a low input signal Di, p-type MOS transistor M6 is in the on state and n-type MOS transistor M7 is in the off state. Then, with a low-state signal applied to p-type MOS transistor M3, p-type MOS transistor M3 is in the on condition and thus, MOS transistor (M1, M3) goes into the saturation region. After receiving the output signal of inverting means, i.e., inverted digital input signal of Di, MOS transistor M8 gives voltage to the gate of MOS transistor M3 which is already in the on state, and plays a role to ensure that the MOS transistor is in the on state. As aforementioned, MOS transistors M2 and M3 implement the symmetrical operation in the same manner as when a high-state digital input signal is applied.

When the current cell circuit is to be designed in accordance with the present invention, each size of the MOS transistors should incorporate the following:

A full large size p-type MOS transistor M1 should be recommended to supply sufficient current; p-type MOS transistors M2 and M3, implementing the symmetrical operation, should be designed to have a minimum channel length to discourage any discharge during cell switching and to reduce the effect of feedthrough; Smaller size MOS transistors M4–M8 should be recommended to reduce the diffusion capacity of gate node in MOS transistors M2 and M3.

According to the present invention, the features of the current cell are apparent in that the signal symmetrical to MOS transistors M2 and M3 can reach the input side of the digital signal determining on or off-state at nearly the same time through additional circuits, thus taking advantage of the differential type, yet having better symmetrical operation and easier design. Therefore, a high-speed D/A converter can be made available and can also be used in a system containing such converter.

This invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed:

1. A current cell for a digital-to-analog converter provided with both p-type MOS transistor M1 for current supply and p-type MOS transistors M2 and M3 for symmetrical operation, comprising of:

an inverting means consisting of p-type and N-type MOS transistors M5 and M4, where the digital input signal of Di is applied to each of gate terminal and where the source terminal is connected to power supply terminal Vdd and ground terminal GND; and a transmission means consisting of n-type MOS transistor M7, where the digital input signal Di is applied to its gate terminal and power supply voltage Vdd is applied to the source terminal, and p-type and n-type MOS transistor M6 and M8, where the digital input signal Di and the output signal of the said inverting means is applied to each of their gate terminal, respectively, whereby the output signal from the said inverting and transmission means is applied to the gate terminals of the said p-type MOS transistors M2 and M3, respectively.

* * * * *